(12) United States Patent
Song

(10) Patent No.: US 10,281,536 B2
(45) Date of Patent: May 7, 2019

(54) SYSTEM AND METHOD FOR HAND-HELD MAGNETIC RESONANCE IMAGING

(71) Applicant: SCHLUMBERGER TECHNOLOGY CORPORATION, Sugar Land, TX (US)

(72) Inventor: Yi-Qiao Song, Newton Center, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 541 days.

(21) Appl. No.: 14/977,072

(22) Filed: Dec. 21, 2015

(65) Prior Publication Data
US 2017/0176550 A1 Jun. 22, 2017

(51) Int. Cl.
G01V 3/00 (2006.01)
G01R 33/341 (2006.01)
G01R 33/50 (2006.01)
G01R 33/38 (2006.01)
G01R 33/483 (2006.01)
G01R 33/24 (2006.01)

(52) U.S. Cl.
CPC ....... G01R 33/341 (2013.01); G01R 33/3802 (2013.01); G01R 33/3808 (2013.01); G01R 33/483 (2013.01); G01R 33/50 (2013.01); G01R 33/243 (2013.01)

(58) Field of Classification Search
USPC ....................................... 324/309
See application file for complete search history.

(56) References Cited

U.S. PATENT DOCUMENTS

| | | | | | |
|---|---|---|---|---|---|
| 5,170,789 A | * | 12/1992 | Narayan | ............ | A61B 1/00142 324/318 |
| 5,390,673 A | * | 2/1995 | Kikinis | .................. | A61B 5/055 324/309 |
| 6,091,241 A | * | 7/2000 | Querleux | ........... | G01R 33/3808 324/300 |

(Continued)

OTHER PUBLICATIONS

Blümich, B. et al., "Mobile Single-Sided NMR", Progress in Nuclear Magnetic Resonance Spectroscopy, 2008, 52(4), pp. 197-269.

(Continued)

Primary Examiner — Rodney E Fuller

(57) ABSTRACT

A system and method for magnetic resonance imaging (MRI) of a subject employs an elongate housing configured to be held and manipulated in a user's hand. The housing supports at least one permanent magnet and at least one RF coil. A device positioning subsystem measures position and orientation of the housing. An electronic subsystem interfaces to the at least one RF coil and to the device positioning subsystem. The electronic subsystem is configured to i) execute pulse sequences where each pulse sequence transmits at least one RF pulse into body tissue of the subject and acquires MRI signals from the body tissue of the subject, ii) acquire position data representing position and orientation of the housing during the pulse sequences from the device positioning subsystem, and iii) process the MRI signals of i) together with the position data of ii) to derive an image of the body tissue of the subject.

38 Claims, 14 Drawing Sheets

(56) References Cited

U.S. PATENT DOCUMENTS

| | | | |
|---|---|---|---|
| 7,271,589 B2* | 9/2007 | Melzi | G01R 33/341 |
| | | | 324/318 |
| 2005/0021019 A1* | 1/2005 | Hashimshony | A61B 5/053 |
| | | | 606/32 |
| 2012/0010497 A1* | 1/2012 | Ehman | G01R 33/3806 |
| | | | 600/410 |
| 2013/0176026 A1 | 7/2013 | Song et al. | |
| 2014/0084927 A1* | 3/2014 | Walsh | G01N 24/081 |
| | | | 324/319 |
| 2015/0038840 A1* | 2/2015 | Hassan | A61B 6/4405 |
| | | | 600/436 |
| 2015/0160312 A1* | 6/2015 | Weinberg | G01R 33/36 |
| | | | 324/309 |
| 2015/0238114 A1* | 8/2015 | Feldkamp | A61B 5/0522 |
| | | | 600/425 |
| 2015/0327841 A1* | 11/2015 | Banjanin | A61B 8/5276 |
| | | | 600/443 |

OTHER PUBLICATIONS

Povencher, S., "CONTIN: A General Purpose Constrained Regulation Program for Inverting Noisy Linear Algebraic and Integral Equations", Computer Physics Communications, 1982, 27, pp. 229-242.

Song, Y-Q. et al., "T1-T2 Correlation Spectra Obtained Using a Fast Two-Dimensional Laplace Inversion", Journal of Magnetic Resonance, 2002, 154(2), pp. 261-268.

* cited by examiner

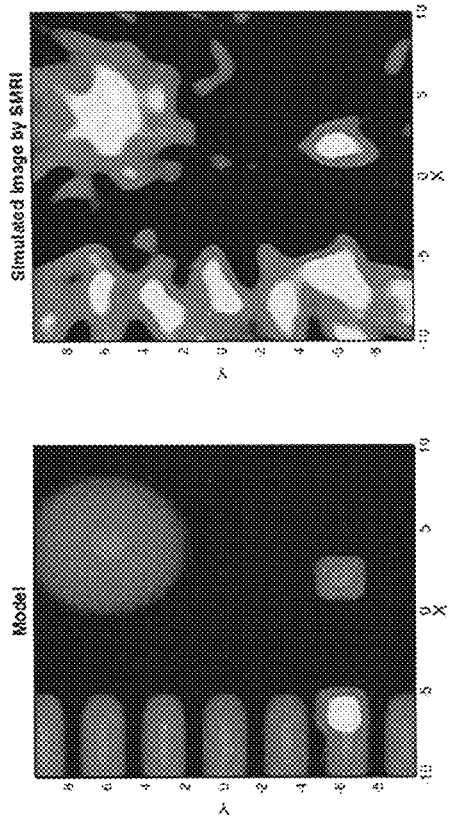
FIG. 9A
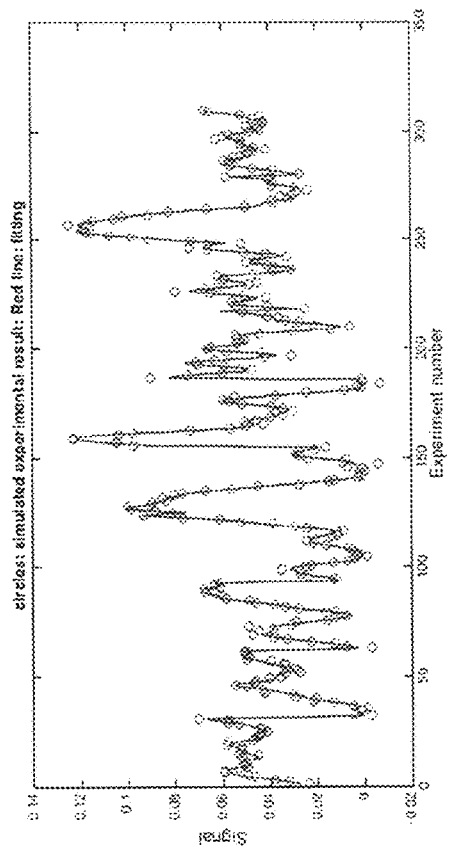
FIG. 9B
FIG. 9C

SYSTEM AND METHOD FOR HAND-HELD MAGNETIC RESONANCE IMAGING

BACKGROUND

The present disclosure relates to magnetic resonance imaging (MRI) systems.

MRI systems are used to investigate the anatomy and physiology of the human body. The physics of MRI systems involves the interaction of matter with electromagnetic fields. The tissue of the human body is largely composed of water molecules, each containing two hydrogen nuclei, or protons. When inside the static magnetic field ($B_0$) of an MRI system, the magnetic moments of these protons align with the direction of the static magnetic field. A radio frequency pulse can be transmitted by a coil into the body, causing the protons to alter their magnetization alignment relative to the static magnetic field. In response to the force bringing them back to their equilibrium orientation, the protons undergo a rotating motion (precession). These changes in magnetization alignment cause a changing magnetic flux, which can be sensed as a time varying voltage signal in the coil. The frequency at which a proton or group of protons in a voxel of the body resonates depends on the strength of the local magnetic field around the proton or group of protons. By applying additional magnetic fields (gradients), specific slices to be imaged can be selected and an image can be obtained.

Diseased tissue, such as tumors, can be detected because the protons in different tissues return to their equilibrium state at different rates (i.e., they have different relaxation times). By changing the operating parameters of the MRI system, this effect can be used to create contrast between different types of body tissue. Contrast agents may be injected intravenously to enhance the appearance of blood vessels, tumors or inflammation. Contrast agents may also be directly injected into a joint in the case of arthrograms, MRI images of joints. Unlike computerized tomography, MRI system do not use ionizing radiation and are generally very safe. MRI systems can be used to image every part of the human body, and is particularly useful for neurological conditions, for disorders of the muscles and joints, for evaluating tumors, and for showing abnormalities in the heart and blood vessels.

In an MRI system, resonant absorption of energy by a proton due to an external oscillating magnetic field will occur at the Larmor frequency for the proton. The spin of the proton has two states. The net longitudinal magnetization in thermodynamic equilibrium is due to a tiny excess of protons in the lower energy state. This gives a net polarization that is parallel to the external oscillating magnetic field. Typically, the magnetic field is caused to vary across the body of the subject by using a field gradient, so that different spatial locations become associated with different precession frequencies. Usually these field gradients are pulsed. The variety of RF and gradient pulse sequences that can be used gives MRI systems their versatility. Application of a radio frequency (RF) pulse can tip this net polarization vector sideways (with, i.e., a so-called 90° pulse), or even reverse it (with a so-called 180° pulse). The recovery of longitudinal magnetization is called longitudinal or T1 relaxation and occurs exponentially with a time constant T1. The loss of phase coherence in the transverse plane is called transverse or T2 relaxation and occurs with a T2 time constant.

A number of MRI schemes have been devised for combining field gradients and radio frequency excitation to create an image. These MRI schemes include 2D or 3D reconstruction from projections (such as in computed tomography), and building the image point-by-point or line-by-line. These MRI schemes employ pulsed field gradients. The pulsed field gradients can be used in two ways: frequency encoding and phase encoding. The use of pulsed field gradients for frequency encoding is accomplished by acquiring a signal with the pulsed field gradient active (ON). In this case, the frequency of the signal is directly related to the location of the signal. The use of pulsed field gradients for phase encoding is accomplished by acquiring a signal after termination of a pulsed field gradient. In this case, the additional phase to the signal, referred to as $\phi$, can be equated to the product $\gamma*g*\delta$, where $\gamma$ is the gyromagnetic ratio of the nuclei detected (often hydrogen, 4257 Hz/G), g is the gradient (unit G/cm), and $\delta$ is the turn-on period of the pulses field gradient (often called pulse length). By multiple acquisition of the signal with different values of the phase $\phi$, the signal dependence on the phase $\phi$ is obtained. This dependence can be used to obtain an image typically via Fourier transform techniques.

These MRI schemes can also use slice selection where the signal from a slice of the measurement space is selected and detected. This is accomplished by transmitting an RF pulse while the field gradient is active (ON). With the field gradient active, the magnetic field within the gradient coil exhibits a linear variation. The RF pulse will then only excite the signals from the position where the frequency of the RF pulse, referred to as f, matches the product of $\gamma$ and the effective magnetic field B, i.e., the product $\gamma*B$, as follows:

$$f \sim \gamma*B. \tag{1}$$

The effective magnetic field B is produced by the magnet and the gradient coil and can be given as:

$$B = B_0 + g*x, \tag{2}$$

where $B_0$ is the static magnetic field produced by the magnet, g is the field gradient (in units of G/cm) produced by the gradient coil, and x is the spatial coordinate (in units of cm).

Note that the contribution of the field gradient g (and its frequency) varies linearly with respect to the coordinate x. Plugging Eqn. (2) into Eqn. (1) gives:

$$f \sim \gamma*(B_0+g*x), \text{ which can be written as} \tag{3a}$$

$$f \sim \gamma B_0 + \gamma(g*x). \tag{3b}$$

With the field gradient g applied along a particular direction (e.g., along the axis for coordinate x), the slice selection plane corresponds to the plane perpendicular to the direction of the field gradient, e.g., the y-z plane in this example. If the field gradient g is applied along the z direction, the slice selection plane will correspond to the x-y plane.

It is also possible to produce other field gradients. For example, a permanent magnet array can be used to produce a constant field gradient whose area will be a sheet which can be curved dependent on the details of the magnet array. In another example, slice selection phase encoding can employ an inhomogeneous field as described in Blümich et al., "Mobile single-sided NMR," Progress in Nuclear Magnetic Resonance Spectroscopy, Vol. 52(4), 2008, pgs. 197-269.

It is also possible to use slice selection with a CPMG pulse sequence to perform projections at different angles. This method is based on project reconstruction (Radon transform) and the inversion requires straight line projections as described in U.S. Patent Application Publication No. 2013/0176026 to Y Song, Fei Han, and Jeff Paulsen.

A typical MRI system includes a large magnet shaped like a cylinder. The inner opening of the cylindrical-like permanent magnet typically has a diameter of 40-60 inches to allow a person to lie inside. The outside diameter of the cylindrical-like permanent magnet is typically about 2 meters. The weight of such system is typically over 1 ton. In addition, the magnet is typically a superconducting magnet that requires cryogenic cooling (liquid nitrogen and helium). Furthermore, RF coils are typically imbedded in the magnet cavity with the corresponding diameter of 40 inches or larger. Because of the large volume, the power needed to energize such RF coils is several kilowatts. In addition, the system employs pulsed gradient coils that require many kilowatts of power for each gradient (typically 3). Thus, an MRI system is always large, expensive in the equipment cost, installation and operation. Most of such systems are permanent installation. The so-called mobile systems are based on permanent magnet and installed in large tractor-trailer and weigh several tons.

Smaller MRI systems have been developed for the imaging of extremities, such as wrist, ankles, and foot. They are an essentially smaller version of the full-body scanners and the technologies and equipment used are essentially the same as the larger counterpart.

All of the MRI systems commercially-available today, including full-body system and extremity systems, employ RF pulses in combinations with pulsed field gradients. They operate to acquire images with stationary equipment (magnet, coils) relative to the subject. Multiple acquisitions are obtained and then an image is formed based on the data.

SUMMARY

A system and method for magnetic resonance imaging (MRI) of a subject is provided that employs an elongate housing configured to be held and manipulated in a user's hand. The housing supports at least one permanent magnet and at least one RF coil. A device positioning subsystem measures position and orientation of the housing. An electronic subsystem interfaces to the at least one RF coil and to the device positioning subsystem. The electronic subsystem is configured to i) execute pulse sequences where each pulse sequence transmits at least one RF pulse into body tissue of the subject and acquires MRI signals from the body tissue of the subject, ii) acquire position data representing position and orientation of the housing during the pulse sequences from the device positioning subsystem, and iii) process the MRI signals of i) together with the position data of ii) to derive an image of the body tissue of the subject.

In some embodiments, the electronic subsystem can be configured to process MRI signals acquired with the housing positioned by the user's hand at a respective position and orientation during at least one pulse sequence in order to derive data representing an MRI property of the body tissue of the subject that is associated with the respective position and orientation of the housing. The electronic subsystem can be further configured to collect the data representing an MRI property of the body tissue of the subject measured at varying position and orientation of the housing together with the position data representing the varying position and orientation of the housing and process the collected data to derive the image of the body tissue of the subject. The MRI property of the body tissue of the subject can be a T2 relaxation time, a T1 relaxation time, a diffusion constant D or combinations thereof.

In some embodiments, the image of the body tissue of the subject is represented by a 2-dimensional or 3-dimensional array of voxels that are fixed in the space that is occupied by the subject during use. The electronic subsystem can include a computer memory that stores a number of kernel matrices corresponding to different positions and orientations of the housing, wherein each kernel matrix defines the contribution of an MRI property derived from MRI signals measured at the corresponding position and orientation of the housing to the voxels of the image of the body tissue of the subject. The electronic subsystem can be further configured to identify kernel matrices that are stored in the computer memory and that correspond to the varying position and orientation of the housing of the collected data. The electronic subsystem can employ inversion of the collected data together with the identified kernel matrices in order to solve for data values that are used to update the voxels of the image of the body tissue of the subject. The collected data and the identified kernel matrices can correspond to a number of scan slices dictated by the varying position and orientation of the housing for a number of pulse sequences. The electronic subsystem can employ inversion of the collected data and the identified kernel matrices corresponding to the number of successive scan slices in order to update the voxels of the image of the body tissue of the subject with data values corresponding to such scan slices.

In some embodiments, the pulse sequences can avoid the use of any pulsed field gradient.

In some embodiments, the electronic subsystem can include a data processor realized by a microprocessor, micro-controller, a digital signal processor or other data processing system. The electronic subsystem can also interface to a display device for displaying the image of the body tissue of the subject. At least part of the electronic subsystem can be enclosed within the housing In some embodiments, at least part of the device positioning subsystem can be enclosed within the housing. For example, the device positioning subsystem can include a gyroscope and an accelerometer enclosed within the housing.

In some embodiments, the device positioning subsystem can be external to the housing. For example, the device positioning subsystem can include at least one articulating arm. In some examples, the device positioning subsystem can perform triangulation using measurement of several angles between the housing and a baseline derived from known positions. In some examples, the device positioning subsystem can include a three-dimensional scanner.

Further features and aspects of example embodiments of the present invention are described in more detail below with reference to the appended Figures.

BRIEF DESCRIPTION OF THE DRAWINGS

FIGS. 9A, 9B and 9C illustrate the operations carried out by the MRI device in deriving data vales for the voxels of an image based upon MRI data acquired by one or more scan slices.

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, systems, processes, and other elements in the invention may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Figure 1:
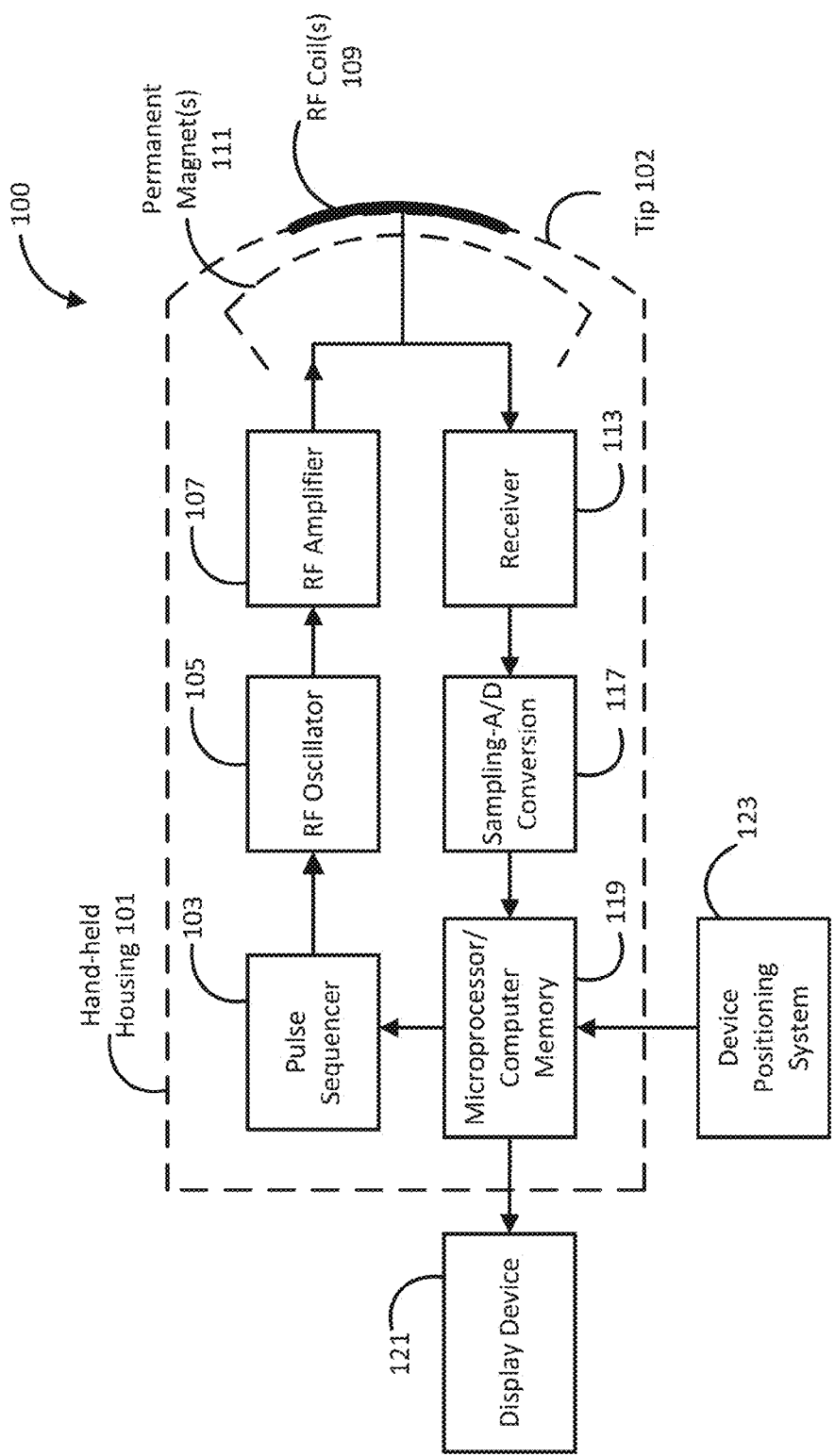
FIG. 1 is a functional block diagram of a system for hand-held magnetic resonance imaging according to an embodiment of the present disclosure.
Figure 2:
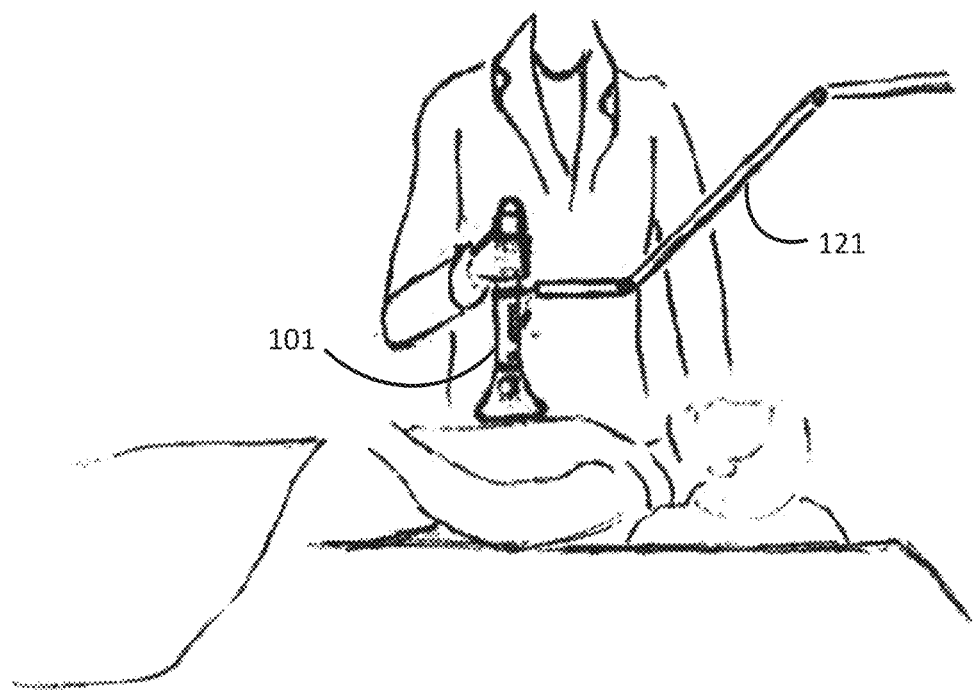
FIG. 2 is a pictorial illustration of the hand-held MRI device of FIG. 1 in use for imaging of the body tissue of a subject.

Turning to FIG. 1, an embodiment of the present application includes a hand-held MRI device 100 having a housing 101 that is configured to be held, grasped and/or otherwise manipulated by the hand of a human operator at varying position and orientations relative to a subject as shown in FIG. 2. The housing 101 supports one or more permanent magnets 111 and one or more RF coils 109. The housing 101 has a distal tip (or end) 102. The permanent magnet(s) 111 can be enclosed within the housing 101 and can be configured to project a static (constant) magnetic field $B_0$ into a three-dimensional target space beyond the distal tip 102. This target space is occupied by body tissue of the subject during use as shown in FIG. 2. The static magnetic field $B_0$ is non-uniform by design and it decays with increasing position away from the distal tip 102. The RF coil(s) 109 can be supported by the housing 101 around the distal tip 102. The RF coil(s) 109 can be configured during use to transmit RF pulses into the body tissue that occupies the target space (which is carried out during an excitation period) and receive MRI signals from the body tissue that occupies the target space (which is carried out during an acquisition period). Many configurations can be used for the RF coil 109, such as a single coil for both transmitting the RF pulses and receiving MRI signals, or separate RF coils for transmitting the RF pulses and for receiving MRI signals, or multiple coils for both transmitting the RF pulses and receiving MRI signals.

The housing 101 of the MRI device 100 can also enclose and mechanically support an electronic subsystem that is configured during use to execute pulse sequences that transmit the RF pulses into the body tissue that occupies the target space and acquire MRI signals from the body tissue that occupies the target space. The main components of the electronic subsystem include a pulse sequencer 103, an RF oscillator 105, an RF amplifier 107, a low noise receiver circuit 113, sampling and analog-to-digital conversion circuitry 117, and a microprocessor with computer memory 119.

The pulse sequencer 103 operates under control of the microprocessor 119 such that the RF Oscillator 105 generates an RF pulse sequence, which is a sequence of one or more pulses of oscillating RF signals that are supplied to the RF coil(s) 109 in order to excite macroscopic nuclear spins in the body tissue that occupies the target space. The microprocessor 119 can possibly control various parameters of the RF pulse sequence. For example, such parameters can include time duration for the excitation period, a pulse amplitude for the RF pulses that are part of the pulse sequence, a pulse phase for such excitation signals, a time duration for the acquisition period, and a time period between the excitation period and the acquisition period. The commonly used pulse sequences could be CPMG, inversion-recovery, saturation recovery, spin-echo based diffusion methods, T1-T2 correlation sequence, and diffusion-editing CPMG sequences, etc.

The RF oscillator 105 can be configured to operate under control of the pulse sequencer 103 to generate a sequence of one or more pulses of an oscillating RF signal at the Lamor frequency at a controlled phase offset relative to a reference oscillating RF signal. The RF amplifier 107 can provide for fixed or variable gain amplification of the pulse signals generated by the RF oscillator for output to the RF coil(s) 109.

The low-noise receiver 113 interfaces to the RF coil(s) 109. The low-noise receiver 113 can provide for fixed or variable gain amplification of the MRI signals detected by the RF coil(s) 109, which may be the free induction decay (FID) or spin echo signals generated by non-equilibrium nuclear spin magnetization precessing in the body tissue that occupies the target space. The receiver 113 can also provide for demodulation and filtering. The signal output of the receiver 113 is supplied to the sampling and analog-to-digital conversion circuit 117 for conversion into digital form for storage and processing by the microprocessor 119.

Note that the interface between the RF amplifier 107 and the RF coil(s) 109 as well as the interface between the RF coil(s) 109 and the low noise receiver 113 can include switching circuitry (e.g., duplexer) and/or tuning circuitry (not shown) as are well known in the art.

The microprocessor 119 can be a commercially-available microprocessor, micro-controller, digital signal processor or other data processing system. The microprocessor 119 can include a computer memory for storing and processing the MRI signals received by the low-noise receiver 113 and converted into digital form by the sampling and analog-to-digital conversion circuitry 117. The microprocessor 119 can also include an interface (such as HDMI cable interface) to a display device 121 (such as an LCD monitor and the like) to support the display of the images derived from the MRI signals as described herein. The microprocessor 119 can possibly interface to one or more user control elements (not shown) that are operated by the user to control operation of the MRI device 100. For example, such user control element(s) can include one or more switches or keys supported on the housing 101 for turning the device on and off and initiating the RF pulse sequence in conjunction with signal acquisition and processing. The user control elements can possibly include other user input devices, such as a pointing device or touch input coordinated with the display of a graphical user interface on the display device 121. As described herein, the RF pulse sequence that perturbs the spin system of the body tissue that occupies the target space can be configured such that useful physical and chemical information can be extracted from the MRI signals received by the low noise receiver 113. For example, in some embodiments, the received MRI signals can be digitized and processed by the microprocessor 119 to measure spin echo properties for one or more RF pulse sequences. From these measurements, the microprocessor 119 can derive MRI properties of the body tissue (such as the T2 relaxation time, T1 relaxation time, a diffusion constant D or combinations thereof), which are used to produce an image of the body tissue. The RF pulse sequence can be a CPMG pulse sequence, which typically includes a 90° pulse followed by an echo train induced by successive 180° pulses. The CPMG pulse sequence can be used to derive the T2 relaxation time of the body tissue. The CPMG pulse sequence can be combined with additional segments to measure a T1 relaxation time and/or a diffusion constant D for the body tissue. For measuring the diffusion constant D, the permanent magnet(s) 111 can be configured to provide a constant magnetic field gradient over the RF pulse sequence(s). Other suitable RF pulse sequences can be used if desired. Note that the RF pulse sequences can avoid the use of any pulsed field gradient and thus avoid the requirement for a gradient coil or the like as part of the device.

The housing 101 can also enclose and mechanically support an electrical power source (such as a battery) for the electronics subsystem as described herein. Alternatively, the electrical power source (such as a battery or power transformer) can be external and coupled to the housing 101 by an electrical cable or other suitable means.

It is also contemplated that the electronic subsystem (or parts thereof) can be installed in a separate unit and connected to the hand-held device (probe) by one or more electrical cables or other suitable means. In this split architecture, the hand-held probe includes the permanent magnet(s) 111 and RF coil(s) 109. It can also include some of the electronics, such as pre-amplifiers, tuning circuitry and switching circuitry (e.g., duplexer) that interface to the RF coil(s) 109 in order to maintain good signal-to-noise ratio.

The microprocessor 119 of the MRI device 100 also interfaces to a device positioning subsystem 123 that is configured to measure the position and orientation of the MRI device 100 during use. The device positioning subsystem 123 can be an external system (as shown in FIG. 1A) or possibly an internal part of the device 100. The device positioning subsystem 123 generates data that represent position and orientation of the MRI device 100 during use, which is supplied to the microprocessor 119 for storage in computer memory and analysis as described herein.

In some embodiments, the device positioning subsystem 123 can employ a 3-axis accelerometer and 3-axis gyroscope that are enclosed and mechanically supported within the housing 101. The accelerometer measures the translational acceleration of the MRI device 100. Double integration of the acceleration data allows the determination of the position of the MRI device 100. The gyroscope measures the rotation of the MRI device 100 and can determine the orientation of the MRI device 100. Combining these two measurements (accelerometer and gyroscope) provides for determination of the position and orientation of the MRI device 100. There are many types of commercially-available accelerometers and gyroscopes that can be used, including the low-cost miniaturized MEMS chips with good accuracy. As these devices tend to drift over time, it is necessary to periodically calibrate them to correct for the drift. Such calibration can be carried out by locating a calibration holder at a known position and orientation near the subject area. Placing the MRI device 100 into the calibration holder can be configured to initiate the calibration process and reset the position and orientation of the MRI device 100.

In some embodiments, the device positioning subsystem 123 can employ locators installed in the room in which the MRI device 100 is operated. Triangulation is a method to locate an object in space from measurement of several angles between the object and the baseline of a few other known positions (locators). For example, as shown in FIG. 2, measurement of the two angles, a1 and a2 at the known points A and B can be used to determine the position of point 0 in a two-dimensional plane. In this case, line AB is the baseline. This triangulation method can be extended to a three-dimensional location when more known positions in three-dimensional space are used. For example, four locator points can be installed at the four corners of the ceiling in the room in which the MRI device 100 is operated. Although three known points would be sufficient, using more than there known points can enhance accuracy and provide redundancy. For example, the additional known points can be used in case that one or more known points are blocked by other objects or the user. Also, the orientation of the MRI device 100 can be determined by locating two points on the MRI device 100.

In some embodiments, the device positioning subsystem 123 can employ a three-dimensional scanner system. Three-dimensional scanner systems are commercially available. Three-dimensional scanner systems commonly employ tri-angulation and trilateration (or a combination of these methods) to locate the position of an object. Three-dimensional scanner systems can also employ a combination of laser scanning and camera to measure the position of an object.

Figure 3:
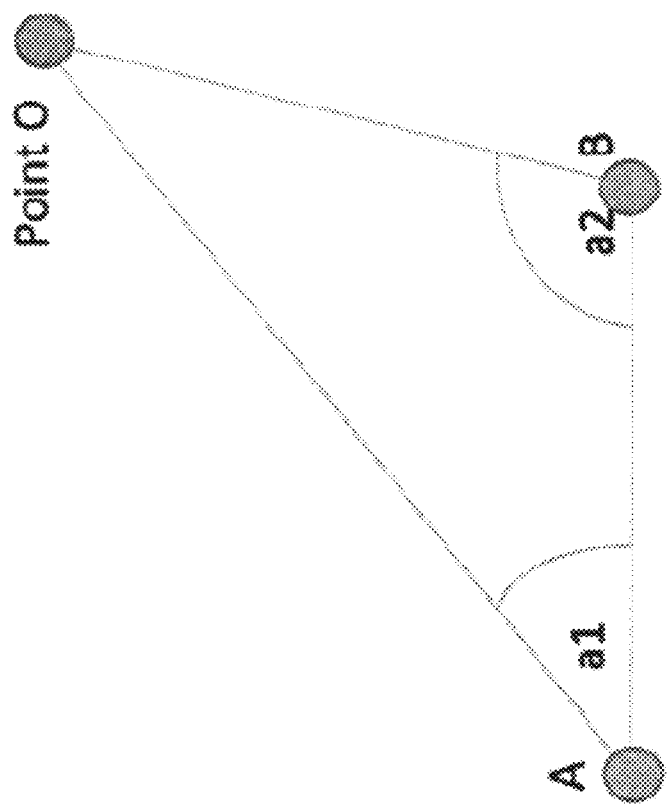
FIG. 3 illustrates a triangulation method that can be used to locate position and orientation of the hand-held MRI device of FIG. 1 according to an embodiment of the present disclosure.
Figure 4:
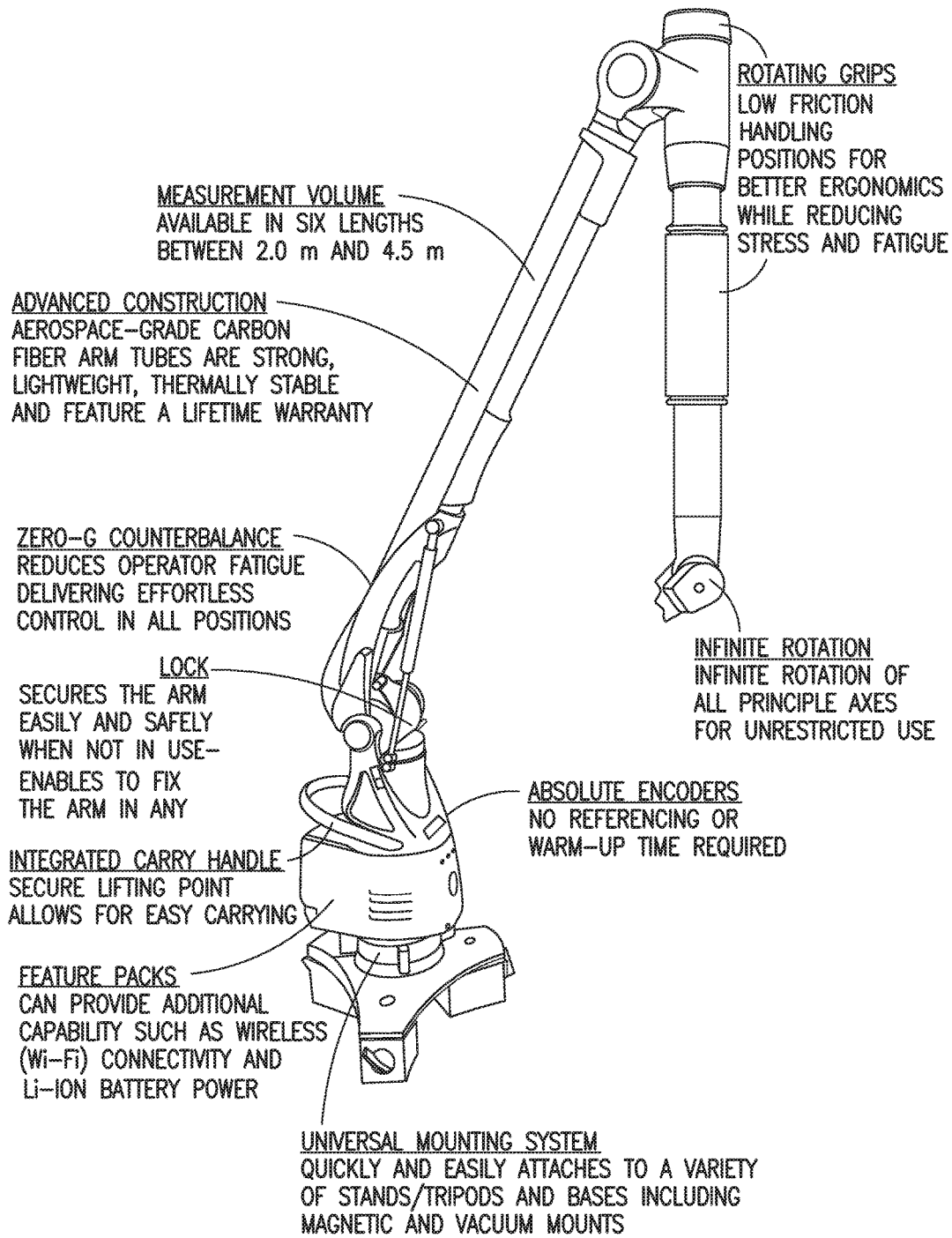
FIG. 4 illustrates a commercially-available mechanical positioning system that can be used to hold and position the MRI device of FIG. 1 and track the position and orientation of the MRI device.

In some embodiments, the device position subsystem 123 can employ a mechanical positioning system. Such mechanical positioning system can employ articulated arms to hold and position the MRI device 100. Such articulated arms are commercially available. Such articulated arms commonly employ a number of rotating joints to allow the full three-dimensional movement of the object. These arms may have angular measurement components installed at each joint so that the position and orientation of the object can be determined. An example of commercially-available articulated arm is shown in FIG. 3.

Figure 5:
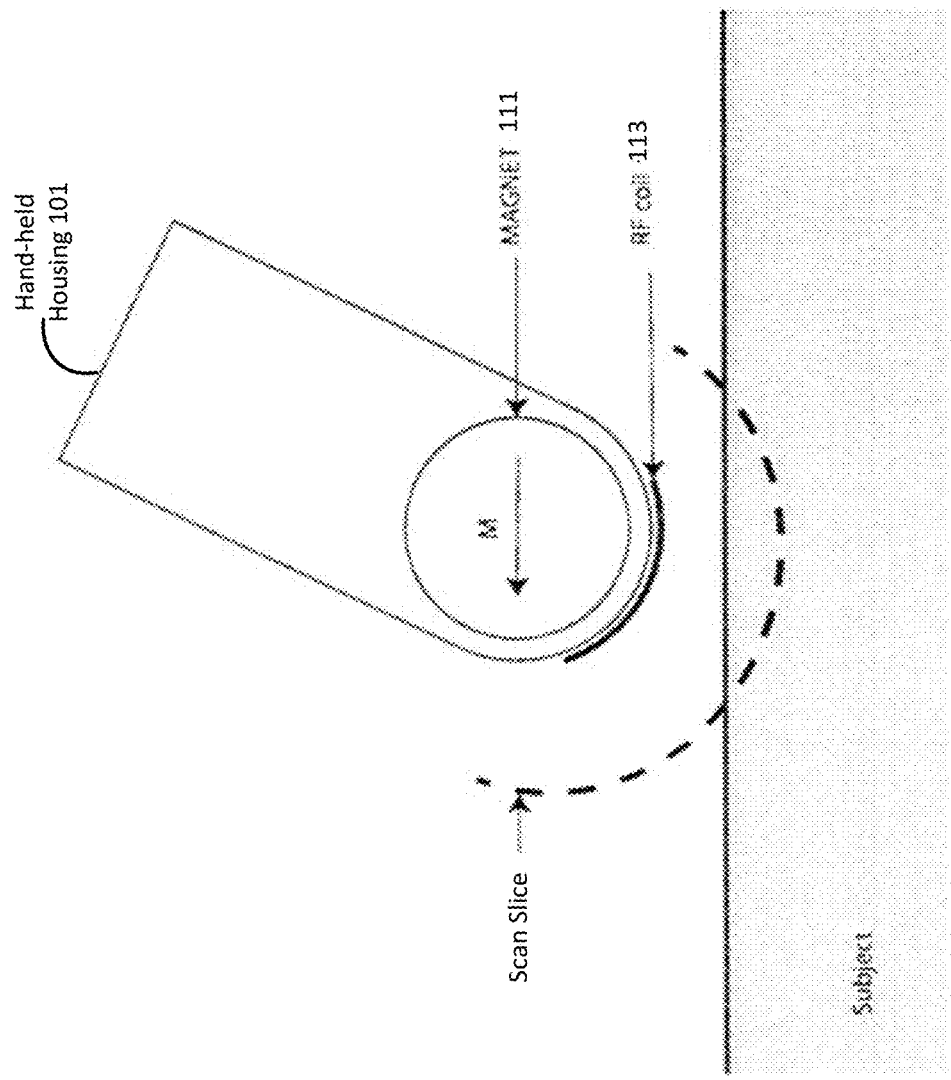
FIG. 5 shows an example configuration of the permanent magnet and RF coil of the MRI device of FIG. 1 and the corresponding scan slice that is measured by this configuration.
Figure 6:
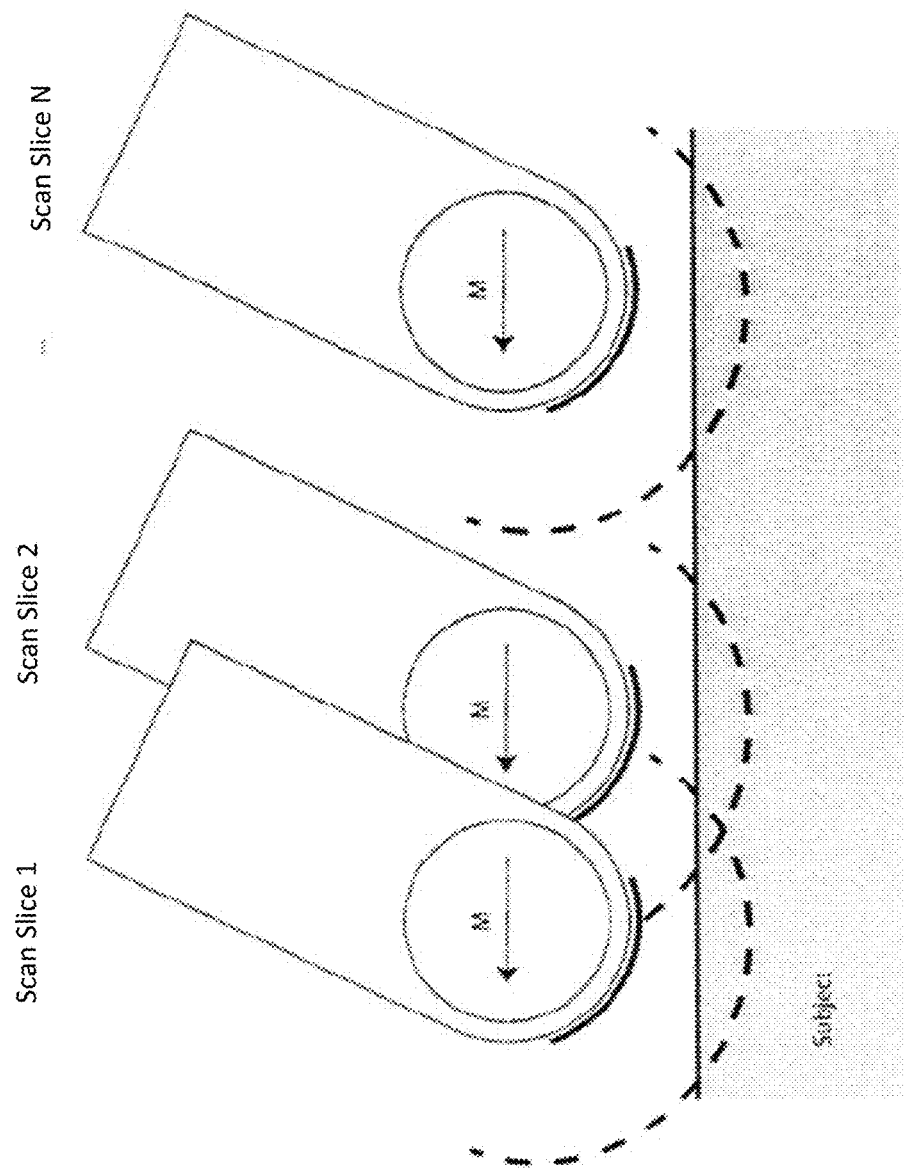
FIG. 6 shows different scan slices that are measured by the example MRI device of FIG. 5 with the MRI device located at different positions with respect to the subject.

In some embodiments, the housing 101 is elongated with the RF coil(s) and the permanent magnet(s) 111 mounted toward the distal tip 102. The permanent magnet(s) 111 can be magnetized to a produce a static magnetic field $B_0$ in a direction primarily transverse to the longitudinal axis of the housing 101 as shown in FIG. 5. The RF coil(s) 109 may have several different designs, such as a surface loop coil mounted on the outside surface of the device housing 101 projecting a pulsed RF magnetic field ($B_1$) outward way from the device tip 109 toward the target space occupied by the subject. Alternatively, the permanent magnet(s) 111 can be magnetized to a produce a static magnetic field $B_0$ along the longitudinal axis of the housing 101, and the RF coil(s) 109 can be a figure-8 coil producing a pulsed RF magnetic field ($B_1$) largely in a direction transverse to the longitudinal axis of the housing 101. Note that these different configurations of RF coil(s) 109 and permanent magnet(s) 111 are intended to arrange the magnetic fields $B_0$ and $B_1$ such that the static magnetic field $B_0$ is generally orthogonal to the pulsed RF magnetic field $B_1$ at least within the target space that is to occupied by the subject during use. In such configurations, the target space is a curved sheet or scan slice that is illustrated as a dashed line in FIG. 5. The target space is also dictated by the specific operating frequency of the RF pulse sequence, in other words the frequency of the oscillating RF signals that make up the RF pulse sequence. If this operating frequency is changed to a different value, the target space will change. Thus, the MRI signal acquired with the MRI device 100 located at a particular position and orientation (angle) relative to the subject (and operating at a particular operating frequency) is derived from the area of the subject that lies within the corresponding scan slice. Note that as the MRI device 100 is located at different positions and/or orientations (angles) with respect to the subject, the MRI signals from different parts of the subject that lies within the different corresponding scan slices as shown in FIG. 6 will be acquired.

Figure 7A:
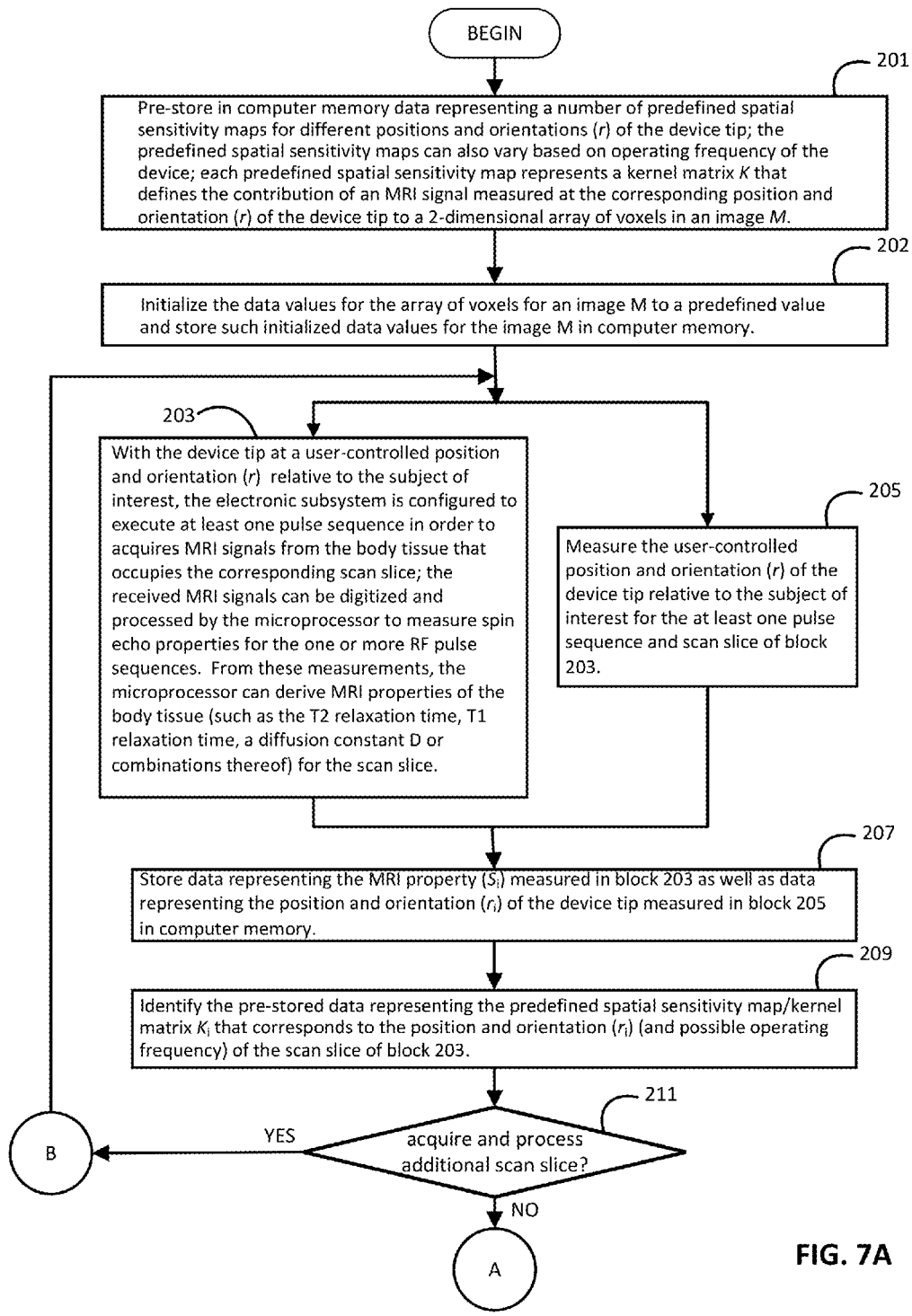
FIGS. 7A and 7B, collectively, is a flow chart illustrating operations carried out by the MRI device in deriving data vales for the voxels of an image based upon MRI data acquired by one or more scan slices.
Figure 7B:
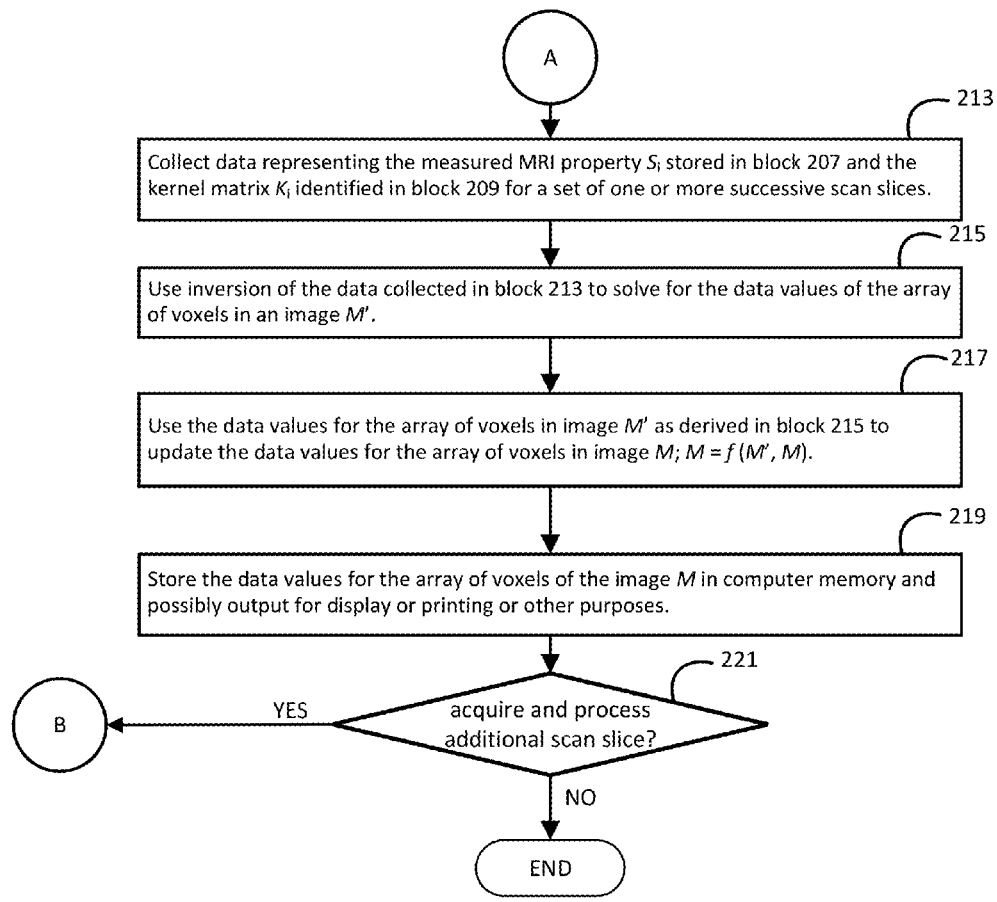

FIGS. 7A and 7B, collectively, is a flow chart illustrating operations carried out by the MRI device 100 in deriving data vales for the voxels of an image based upon MRI data acquired by one or more scan slices. The operations begin in block 201 where computer memory 119 is configured to pre-store data representing a number of predefined spatial sensitivity maps for different positions and orientations (r) of the distal tip 102 of the MRI device 100. The predefined spatial sensitivity maps can also vary based on the operating frequency of the MRI device 100. Each predefined spatial sensitivity map represents a kernel matrix K that defines the contribution of an MRI property which is derived from MRI signals measured at the corresponding position and orientation (r) of the distal tip 102 of the device 100 (and possible operating frequency) to a 2-dimensional array of voxels in an image M where the voxels of the image M are fixed in the space that is occupied by the subject during use.

In block 202, the microprocessor 119 is configured to initialize the data values for the voxels of the image M to a predefined value and store such initialized data values for the image M in the computer memory.

In block 203, with the device tip 102 held at a user-controlled position and orientation (r) relative to the subject, the electronic subsystem of the MRI device 100 is configured to execute at least one pulse sequence that transmits one or more RF pulses of a particular operating frequency into the body tissue that occupies the corresponding scan slice and acquires MRI signals from the body tissue that occupies the corresponding scan slice. The received MRI signals can be digitized and processed by the microprocessor 119 to measure spin echo properties for the one or more RF pulse sequences. From these measurements, the microprocessor 119 can derive an MRI property ($S_i$) of the body tissue (such as the T2 relaxation time, T1 relaxation time, a diffusion constant D or combinations thereof) for the scan slice.

In block 205, the device positioning subsystem 123 is configured to measure the position and orientation (r) of the device tip 102 relative to the subject during the pulse sequence operations of the electronic subsystem in block 203.

In block 207, the microprocessor 119 can be configured to store data representing the MRI property ($S_i$) measured in block 203 as well as data representing the position and orientation ($r_i$) of the device tip measured in block 205 in computer memory.

In block 209, the microprocessor 119 can be configured to identify the data representing the predefined spatial sensitivity map/kernel matrix $K_i$ that corresponds to the position and orientation ($r_i$) (and possible operating frequency) of the scan slice of block 203 as stored in the computer memory in block 201.

In block 211, the microprocessor 119 can be configured to determine whether one or more additional scan slices will be acquired and processed. If so, the operations return to perform one or more iterations of blocks 203, 205, 207 and 209 for the additional scan slice(s). If not, the operations continue to block 213.

In block 213, the microprocessor 119 can be configured to collect data representing the measured MRI property $S_i$ stored in block 207 and the kernel matrix $K_i$ identified in block 209 for a set of one or more successive scan slices. Note that the one or more of the successive scan slices can differ from one another and thus correspond to varying position and orientation ($r_i$) (and possible operating frequency) of the MRI device 100. However, this need not always be the case and thus one or more of the successive scan slices can be the same scan slice that corresponds to the same position and orientation ($r_i$) (and possible operating frequency) of the MRI device 100.

In block 215, the microprocessor 119 can be configured to use inversion of the data collected in block 213 to solve for the data values of the array of voxels in an image M'. The voxels of the image M' are fixed in the space that will be occupied by the subject in a manner that matches the voxels of the image M. Thus, there is a one-to-one correspondence for the voxels of the image M' and the voxels of the image M.

In some embodiments, the solution for M' can be derived by expressing the MRI property data $S_i$ for the successive scan slices in a one-dimensional vector format. Each kernel matrix $K_i$ can also be expressed in a one-dimensional vector format. The image could be a 2-dimensional or 3 dimensional array of voxels, and M' is a one-dimensional vector representing the same image M in the one-dimensional format to give:

$$S = K * M', \text{ which can be written as} \tag{4a}$$

$$\begin{bmatrix} S_1 \\ S_2 \\ \vdots \end{bmatrix} = \begin{bmatrix} K_1 \\ K_2 \\ \vdots \end{bmatrix} \begin{bmatrix} M'_1 \\ M'_2 \\ \vdots \end{bmatrix} \tag{4b}$$

where $S_1, S_2 \ldots$ is the collection of MRI property data for the successive scan slices, $K_1, K_2 \ldots$ is the respective kernel matrices for the successive scan slices, and $M'_1, M'_2 \ldots$ are the voxels of the voxel array of image M' expressed in a one-dimensional vector format.

Many algorithms can be used to invert the MRI property data $S_i$ to obtain the image M'. They are in general a least-square fit to the data. In some cases, if the kernel matrices $K_1, K_2 \ldots$ are singular, then regularization methods can be used to stabilize the image. Furthermore, if the image data (all data values for the voxels of image M') are positive or zero, then a non-negativity constraint can be applied to improve the inversion. When the kernel matrices $K_1, K_2 \ldots$ are singular, then a singular value decomposition may be used. In this case, only those values that exceed certain threshold determined by the SNR of the data are selected. When the kernel matrices $K_1, K_2 \ldots$ are not singular, the image M' can be derived from:

$$M' = (K'K)^{-1}K'S, \tag{5}$$

where K' is the transpose of K, and $(\ )^{-1}$ is the matrix inversion.

This is essentially a least-square fitting method. Note that other methods that are based on regularization can also be used. Examples of such algorithms are Povencher, S., "CONTIN: a general purpose constrained regularization program for inverting noisy linear algebraic and integral equations," Comput. Phys. Commun., Vol. 27, 1982, pgs. 229-242; and Song, Y.-Q., Venkataramanan, L., Hürlimann, M. D., Flaum, M., Frulla, P., & Straley, C., "T1-T2 correlation spectra obtained using a fast two-dimensional Laplace inversion," Journal of Magnetic Resonance, Vol. 154(2), 2002, pgs. 261-268.

In block 217, the microprocessor 119 can be configured to use the data values for the array of voxels in image M' as derived in block 215 to update the data values for the array of voxels in the image M. In this operation, the data values for the voxels in image M' as derived in block 215 can be used to replace the default data values that were initialized for the image M in block 202. In other cases where the image M has been updated from its initial values (by one or more previous iterations of block 217), the data values for the voxels in image M' can be merged with the most-recent data values for the voxels of the image M by averaging or other means in order to calculate the data values for the voxels in updated image M. Such merge operations allow the image M to be updated by data values derived from one or more successive scan slices as additional scan slice measurements (either for the same scan slice or different scan slices) are acquired and processed.

In block 219, the microprocessor 119 can be configured to store the data values for the array of voxels of the image M as calculated in block 217 in computer memory. Such data values can possibly be output for display on display device 121 or output for printing or other purposes.

In block 221, the microprocessor 119 can be configured to determine whether one or more additional scan slices will be acquired and processed. If so, the operations return to perform one or more iterations of blocks 203 to 219 for the additional scan slice(s) that contribute to the image M. If not, the operations end. The determination of bloc 221 can be based on user input where the user determines whether further scan slices are needed according to the image M obtained so far. The further scan slices can be focused in a particular area of the subject's body if the user determines that better resolution is required in that area, for example.

Figure 8:
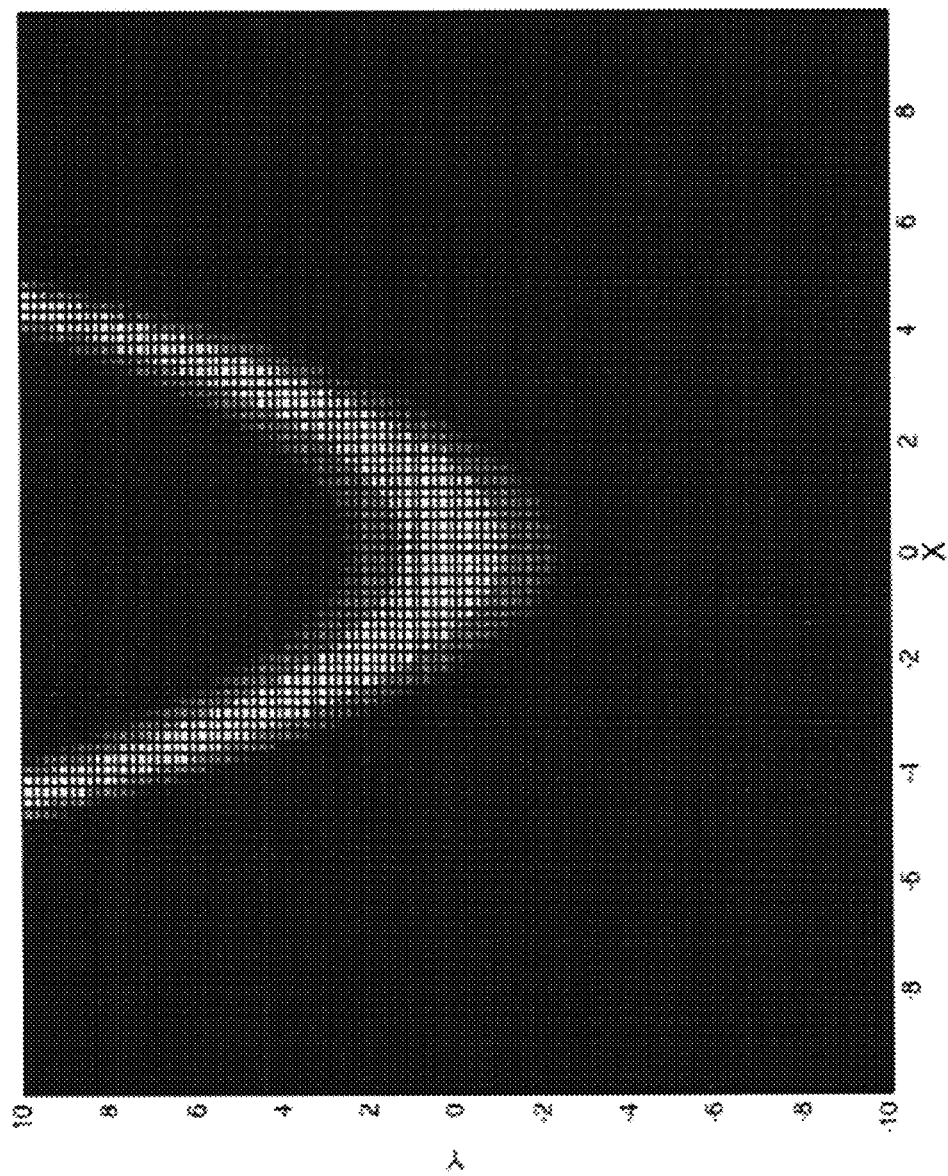
FIG. 8 illustrates an example spatial sensitivity map/kernel matrix K for a particular position and orientation (r) of the housing of the MRI device.

FIG. 8 illustrates an example spatial sensitivity map/kernel matrix K for a particular position and orientation (r) of the distal tip 102 of the MRI device 100. The spatial sensitivity map/kernel matrix K defines the contribution of an MRI property derived from MRI signals measured at the particular position and orientation (r) to a 2-dimensional array of voxels in an image M. This spatial sensitivity map/kernel matrix K employs grayscale data values where white data values represent high sensitivity as compared to black data values.

FIGS. 9A, 9B and 9C illustrate the operations carried out by the MRI device 100 in deriving data vales for the voxels of an image based upon MRI data acquired by one or more scan slices. FIG. 9A is model image showing various features that are artificially created to represent different geometries and different feature sizes. The black color represents zero intensity voxels and the white represents high intensity voxels. FIG. 9B shows the image derived from a total of about 300 scan slice measurement made at different positions and orientations of the MRI device. The image is essentially the result of M' reformatted back to the 2-dimensional array. FIG. 9C shows the MRI signal (the set of values $S_i$) acquired for the 300 scan slice measurements as well as a fitted line. The circles are $S_i$, and the fit is essentially KM'. Note that main feature of the model image of FIG. 9A are found in the resultant image of FIG. 9B. For example, the closely spaced features on the left are resolved in the image.

FIGS. 10A through 14D are also provided to illustrate the operations carried out by the MRI device 100 in deriving data vales for the voxels of an image based upon MRI data acquired by one or more scan slice measurements that follows the flow chart of FIGS. 7A and 7B.

Figure 10A:
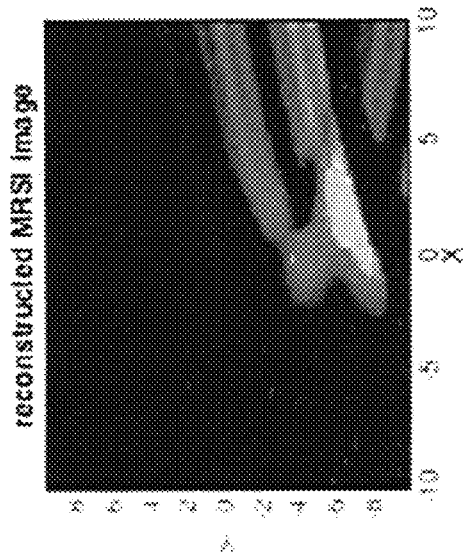
FIGS. 10A, 10B, 10C and 10D illustrate the operations carried out by the MRI device when positioned to scan the bottom right corner of an image.
Figure 10B:
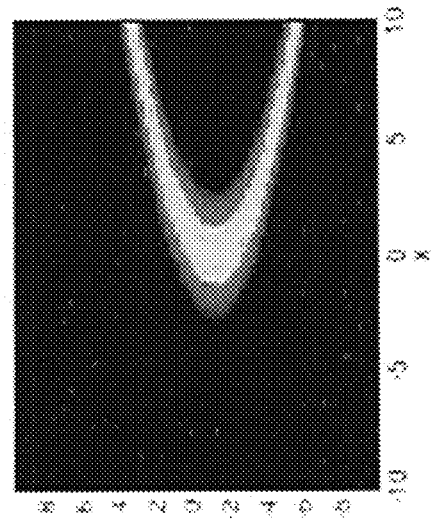
Figure 10C:
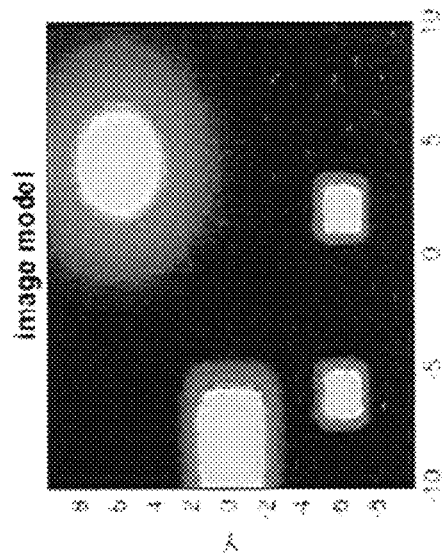
Figure 10D:
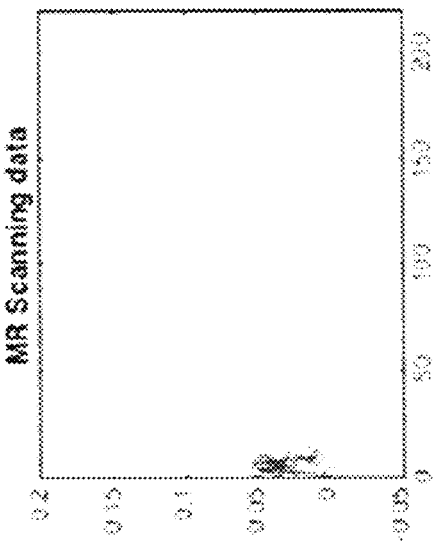

FIGS. 10A, 10B, 10C and 10D illustrate the operations carried out by the MRI device 100 when positioned to scan the bottom right corner of the image. Thus, only the image in that corner is showing up first. Similar to FIG. 9A, FIG. 10A is a model image showing various features. Similar to FIG. 9B, FIG. 10B shows the image derived from a number of scan slice measurements made at different positions and orientations of the MRI device that scan the bottom right corner of the image. Similar to FIG. 9C, FIG. 10C shows the MRI signal acquired for these bottom right corner scan slice measurements as well as a fitted line. At this stage of the imaging, only five scans are performed and both the image and the fit are obtained through the inversion that only includes these five data points. FIG. 10D shows an example spatial sensitivity map/kernel matrix K for a particular position and orientation (r) of MRI device 100 is scanning the bottom right corner of the image.

Figure 11A:
FIGS. 11A, 11B, 11C and 11D illustrate the operations carried out by the MRI device when positioned to scan the upper right corner of the image.
Figure 11B:
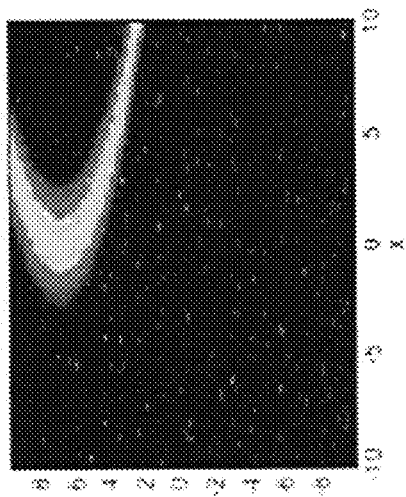
Figure 11C:
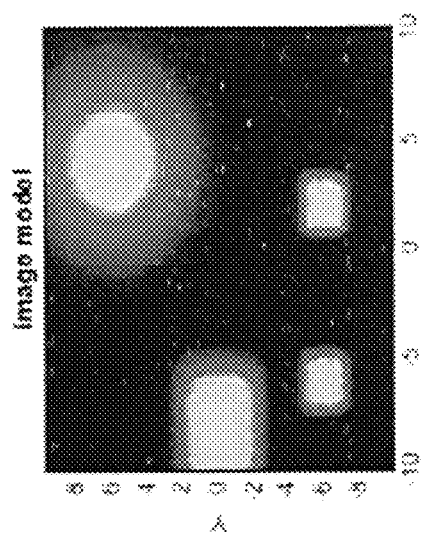
Figure 11D:
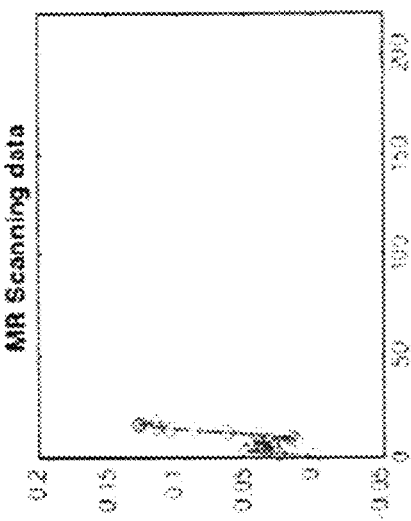

The MRI device 100 can then be positioned to scan the upper right corner of the image as illustrated in FIGS. 11A, 11B, 11C and 11D in order to fill in the right side of the image. Similar to FIG. 10A, FIG. 11A is the model image showing various features. Similar to FIG. 10B, FIG. 11B shows the image derived from a number of scan slice measurements made at different positions and orientations of the MRI device that scan the upper right corner of the image. Similar to FIG. 10C, FIG. 11C shows the MRI signal acquired for these upper right corner scan slice measurements as well as a fitted line. At this stage, about 12 data points are used to construct the image and the fit. FIG. 11D shows an example spatial sensitivity map/kernel matrix K for a particular position and orientation (r) of MRI device 100 is scanning the upper right corner of the image.

Figure 12A:
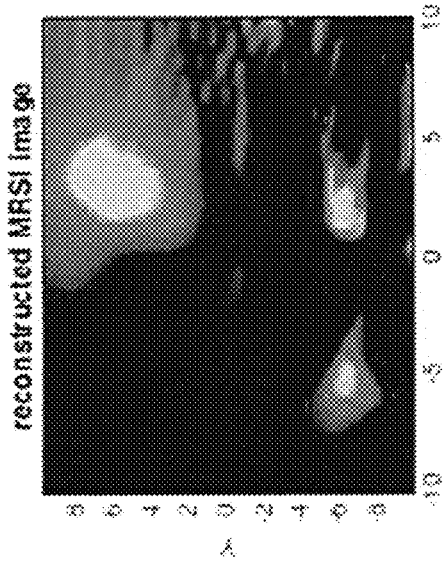
FIGS. 12A, 12B, 12C and 12D illustrate the operations carried out by the MRI device when positioned to repeat scanning the bottom right corner of the image.
Figure 12B:
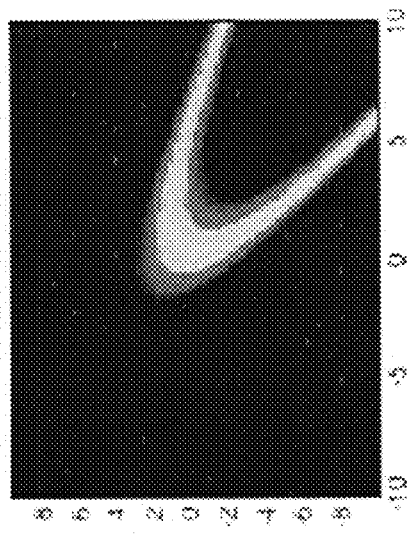
Figure 12C:
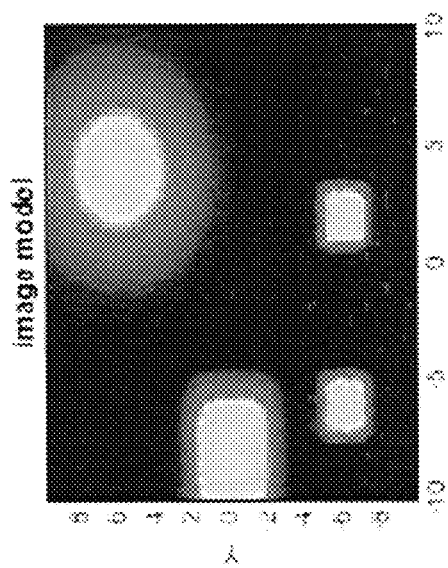
Figure 12D:
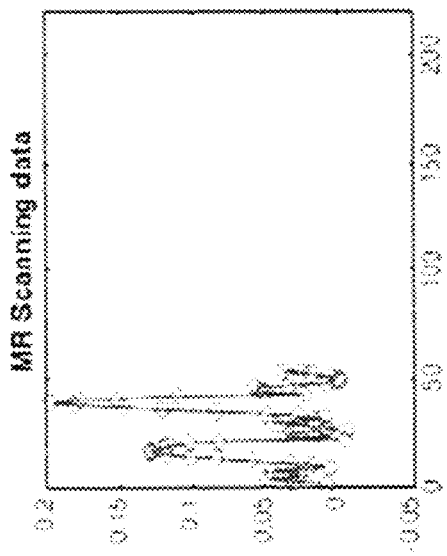

The MRI device 100 can then be positioned to repeat scanning the bottom right corner of the image as illustrated in FIGS. 12A, 12B, 12C and 12D in order to provide better resolution to the right side of the image. Similar to FIGS. 10A and 11A, FIG. 12A is the model image showing various features. Similar to FIGS. 10B and 11B, FIG. 12B shows the image derived from a number of scan slice measurements made at different positions and orientations of the MRI device that scan the lower right corner of the image. Similar to FIGS. 10C and 11C, FIG. 12C shows the MRI signal acquired for these lower right corner scan slice measurements as well as a fitted line. At this stage, about 50 scans are performed to obtain the image and fit. FIG. 12D shows an example spatial sensitivity map/kernel matrix K for a particular position and orientation (r) of MRI device 100 is scanning the lower right corner of the image.

Figure 13A:
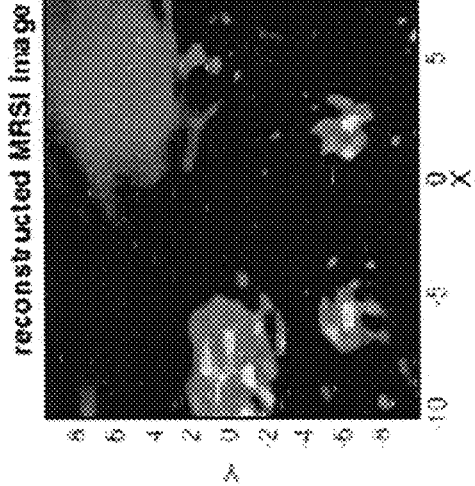
FIGS. 13A, 13B, 13C and 13D illustrate the operations carried out by the MRI device when positioned to scan the left side of the image.
Figure 13B:
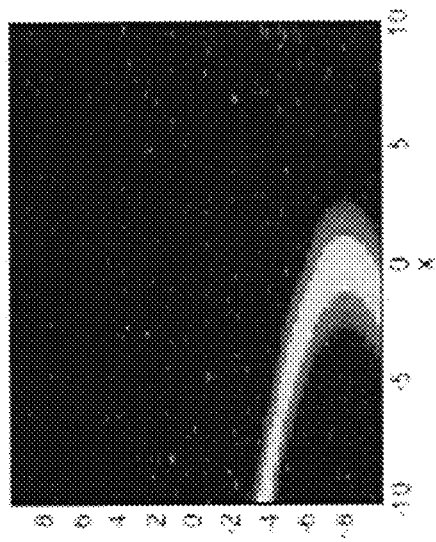
Figure 13C:
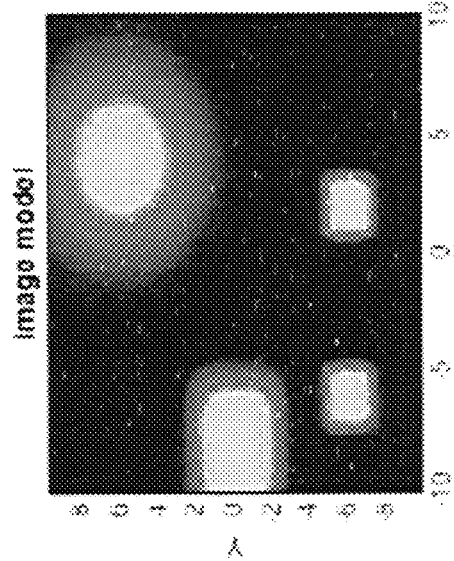
Figure 13D:
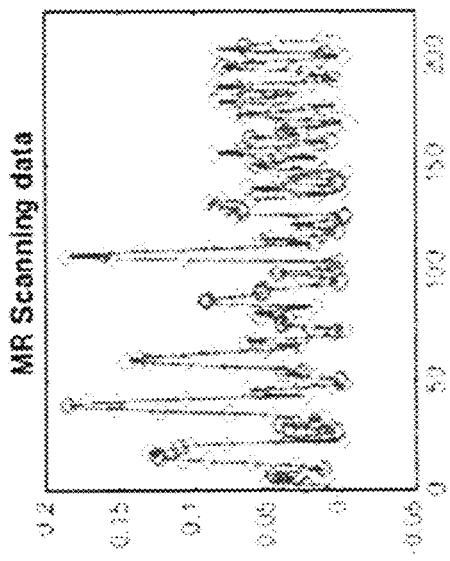

The MRI device 100 can then be positioned to scan the left side of the image as illustrated in FIGS. 13A, 13B, 13C and 13D in order to fill in the left side of the image. Similar to FIGS. 10A, 11A and 12A, FIG. 13A is the model image showing various features. Similar to FIGS. 10B, 11B and 12B, FIG. 13B shows the image derived from a number of scan slice measurements made at different positions and orientations of the MRI device that scan the left side of the image. Similar to FIGS. 10C, 11C and 12C, FIG. 13C shows the MRI signal acquired for these left side scan slice measurements as well as a fitted line. At this stage, about 200 scans are performed to obtain the image and the fit. FIG. 13D shows an example spatial sensitivity map/kernel matrix K for a particular position and orientation (r) of MRI device 100 is scanning the left side of the image. Note that as scanning progresses, more image features appear and become clearer. The scanning can be terminated when all major features are imaged well.

The above demonstration is made for 2-dimensional examples. In this case, scans with different orientations along 1 axis are needed. For a 3-dimensional image, scans with different orientations along two axes are needed.

There have been described and illustrated herein several embodiments of a system and method for hand-held magnetic resonance imaging. While particular embodiments of the invention have been described, it is not intended that the invention be limited thereto, as it is intended that the invention be as broad in scope as the art will allow and that the specification be read likewise. It will therefore be appreciated by those skilled in the art that yet other modifications could be made to the provided invention without deviating from its spirit and scope as claimed.

What is claimed is:

1. A system for magnetic resonance imaging (MRI) of a subject, the system comprising;
    an elongate housing configured to be held and manipulated by a user's hand, wherein the housing supports at least one permanent magnet and at least one RF coil;
    a device positioning subsystem for measuring position and orientation of the housing; and
    an electronic subsystem that interfaces to the at least one RF coil and to the device positioning subsystem;
    wherein the electronic subsystem is configured to i) execute pulse sequences where each pulse sequence transmits at least one RF pulse into body tissue of the subject and acquires MRI signals from the body tissue of the subject, ii) acquire position data representing position and orientation of the housing during the pulse sequences from the device positioning subsystem, and iii) process the MRI signals of i) together with the position data of ii) to derive an image of the body tissue of the subject, wherein the image is based on an MRI property of the body tissue of the subject over an array of voxels that is fixed in space that is occupied by the subject during use of the system; and
    wherein the electronic subsystem includes a computer memory storing a number of kernel matrices that correspond to different positions and orientations of the housing and that are used to derive the image of the body tissue of the subject, wherein each kernel matrix defines the contribution to the MRI property derived from MRI signals measured at the corresponding position and orientation of the housing from the array of voxels.

2. A system according to claim 1, wherein:
    the electronic subsystem is further configured to process MRI signals acquired with the housing positioned by the user's hand at a respective position and orientation during at least one pulse sequence in order to derive data representing the MRI property of the body tissue of the subject that is associated with the respective position and orientation of the housing.

3. A system according to claim 2, wherein:
    the electronic subsystem is further configured to collect the data representing the MRI property of the body tissue of the subject measured at varying position and orientation of the housing together with the position data representing the varying position and orientation of the housing and process the collected data to derive the image of the body tissue of the subject.

4. A system according to claim 3, wherein:
    the electronic subsystem is further configured to identify kernel matrices that are stored in the computer memory or calculated by the electronic subsystem and that correspond to the varying position and orientation of the housing of the collected data.

5. A system according to claim 4, wherein:
    the electronic subsystem is further configured to employ inversion of the collected data together with the identified kernel matrices in order to solve for data values that are used to update the array of voxels of the image of the body tissue of the subject.

6. A system according to claim 4, wherein:
the collected data and the identified kernel matrices correspond to a number of scan slices dictated by the varying position and orientation of the housing for a number of pulse sequences; and
the electronic subsystem employs inversion of the collected data and the identified kernel matrices corresponding to the number of successive scan slices in order to update the array of voxels of the image of the body tissue of the subject with data values corresponding to such scan slices.

7. A system according to claim 1, wherein:
the MRI property of the body tissue of the subject is selected from the group consisting of a T2 relaxation time, a T1 relaxation time, a diffusion constant D, and a combination thereof.

8. A system according to claim 1, wherein:
the array of voxels comprises a 2-dimensional or 3-dimensional array of voxels that is fixed in the space that is occupied by the subject during use of the system.

9. A system according to claim 1, wherein:
the pulse sequences avoid the use of any pulsed field gradient.

10. A system according to claim 1, wherein:
the electronic subsystem includes a data processor realized by a microprocessor, micro-controller, a digital signal processor or other data processing system.

11. A system according to claim 1, wherein:
the electronic subsystem interfaces to a display device for displaying the image of the body tissue of the subject.

12. A system according to claim 1, wherein:
at least part of the electronic subsystem is enclosed within the housing.

13. A system according to claim 1, wherein:
the device positioning subsystem comprises a gyroscope and an accelerometer enclosed within the housing.

14. A system according to claim 1, wherein:
the device positioning subsystem is external to the housing.

15. A system according to claim 14, wherein:
the device positioning subsystem comprises at least one articulating arm.

16. A system according to claim 14, wherein:
the device positioning subsystem performs triangulation using measurement of several angles between the housing and a baseline derived from known positions.

17. A system according to claim 14, wherein:
the device positioning subsystem comprises a 3D scanner.

18. A method for magnetic resonance imaging (MRI) of a subject, the method comprising:
providing an MRI system that includes an elongate housing, a device positioning subsystem and an electronic subsystem, wherein the housing is configured to be held and manipulated by a user's hand and to support at least one permanent magnet and at least one RF coil, wherein the device positioning subsystem is configured to measure position and orientation of the housing, and wherein the electronic subsystem interfaces to the at least one RF coil and to the device positioning subsystem; and
with position and orientation of the housing controlled by the user's hand, configuring the electronic subsystem to i) execute a plurality of pulse sequences where each pulse sequence transmits at least one RF pulse into body tissue of the subject and acquires MRI signals from the body tissue of the subject, ii) acquire position data representing position and orientation of the housing during the plurality of pulse sequences from the device positioning subsystem, and iii) process the MRI signals of i) together with the position data of ii) to derive an image of the body tissue of the subject, wherein the image is based on an MRI property of the body tissue of the subject over an array of voxels that is fixed in space that is occupied by the subject during use of the system;
wherein the electronic subsystem includes a computer memory storing a number of kernel matrices that correspond to different positions and orientations of the housing and that are used to derive the image of the body tissue of the subject, wherein each kernel matrix defines the contribution to the MRI property derived from MRI signals measured at the corresponding position and orientation of the housing from the array of voxels.

19. A method according to claim 18, wherein:
the electronic subsystem processes MRI signals acquired with the housing positioned by the user's hand at a respective position and orientation during at least one pulse sequence in order to derive data representing the MRI property of the body tissue of the subject that is associated with the respective position and orientation of the housing.

20. A method according to claim 19, wherein:
the electronic subsystem collects the data representing the MRI property of the body tissue of the subject measured at varying position and orientation of the housing together with the position data representing the varying position and orientation of the housing; and
the electronic subsystem processes the collected data to derive the image of the body tissue of the subject.

21. A method according to claim 20, wherein:
the electronic subsystem identifies kernel matrices that are stored in the computer memory and that correspond to the varying position and orientation of the housing of the collected data.

22. A method according to claim 21, wherein:
the electronic subsystem employs inversion of the collected data together with the identified kernel matrices in order to solve for data values that are used to update the array of voxels of the image of the body tissue of the subject.

23. A method according to claim 21, wherein:
the collected data and the identified kernel matrices correspond to a number of scan slices dictated by the varying position and orientation of the housing for a number of pulse sequences; and
the electronic subsystem employs inversion of the collected data and the identified kernel matrices corresponding to the number of successive scan slices in order to update the array of voxels of the image of the body tissue of the subject with data values corresponding to such scan slices.

24. A system according to claim 18, wherein:
the MRI property of the body tissue of the subject is selected from the group consisting of a T2 relaxation time, a T1 relaxation time, a diffusion constant D, and a combination thereof.

25. A method according to claim 18, wherein:
the array of voxels comprises a 2-dimensional or 3-dimensional array of voxels that is fixed in the space that is occupied by the subject during use.

26. A method according to claim 18, wherein:
the pulse sequences avoid the use of any pulsed field gradient.

27. A system for magnetic resonance imaging (MRI) of a subject, the system comprising;
    an elongate housing configured to be held and manipulated by a user's hand, wherein the housing supports at least one permanent magnet and at least one RF coil;
    a device positioning subsystem for measuring position and orientation of the housing; and
    an electronic subsystem that interfaces to the at least one RF coil and to the device positioning subsystem;
    wherein the electronic subsystem is configured to i) execute pulse sequences where each pulse sequence transmits at least one RF pulse into body tissue of the subject and acquires MRI signals from the body tissue of the subject, ii) acquire position data representing position and orientation of the housing during the pulse sequences from the device positioning subsystem, and iii) process the MRI signals of i) together with the position data of ii) to derive an image of the body tissue of the subject, wherein the image is based on an MRI property of the body tissue of the subject over an array of voxels that is fixed in space that is occupied by the subject during use of the system; and
    wherein the pulse sequences avoid the use of any pulsed field gradient.

28. A system according to claim 27, wherein:
    the MRI property of the body tissue of the subject is selected from the group consisting of a T2 relaxation time, a T1 relaxation time, a diffusion constant D, and a combination thereof.

29. A system according to claim 27, wherein:
    the array of voxels comprises a 2-dimensional or 3-dimensional array of voxels that is fixed in the space that is occupied by the subject during use of the system.

30. A system according to claim 27, wherein:
    the electronic subsystem includes a computer memory that stores a number of kernel matrices corresponding to different positions and orientations of the housing, wherein each kernel matrix defines the contribution to an MRI property derived from MRI signals measured at the corresponding position and orientation of the housing from the voxels of the image of the body tissue of the subject.

31. A system according to claim 30, wherein:
    the electronic subsystem is further configured to collect data representing the MRI property of the body tissue of the subject measured at varying position and orientation of the housing during at least one pulse sequence together with the position data representing the varying position and orientation of the housing and process the collected data to derive the image of the body tissue of the subject.

32. A system according to claim 31, wherein:
    the electronic subsystem is further configured to identify kernel matrices that are stored in the computer memory or calculated by the electronic subsystem and that correspond to the varying position and orientation of the housing of the collected data.

33. A system according to claim 32, wherein:
    the electronic subsystem employs inversion of the collected data together with the identified kernel matrices in order to solve for data values that are used to update the array of voxels of the image of the body tissue of the subject.

34. A system according to claim 32, wherein:
    the collected data and the identified kernel matrices correspond to a number of scan slices dictated by the varying position and orientation of the housing for a number of pulse sequences; and
    the electronic subsystem employs inversion of the collected data and the identified kernel matrices corresponding to the number of successive scan slices in order to update the array of voxels of the image of the body tissue of the subject with data values corresponding to such scan slices.

35. A system according to claim 27, wherein:
    the electronic subsystem includes a data processor realized by a microprocessor, micro-controller, a digital signal processor or other data processing system; and
    at least part of the electronic subsystem is enclosed within the housing.

36. A system according to claim 27, wherein:
    the electronic subsystem interfaces to a display device for displaying the image of the body tissue of the subject.

37. A system according to claim 27, wherein:
    the device positioning subsystem includes at least of: i) a gyroscope and an accelerometer enclosed within the housing, ii) at least one articulating arm, and iii) a 3D scanner.

38. A system according to claim 27, wherein:
    the at least one RF coil consists of a single RF coil for both transmitting RF pulses and for receiving MRI signals; or
    the at least one RF coil consists of two separate RF coils, including one RF coil for transmitting RF pulses and another RF coil for receiving MRI signals.

* * * * *